United States Patent [19]
Sakata et al.

[11] Patent Number: 6,091,019
[45] Date of Patent: Jul. 18, 2000

[54] PHOTOVOLTAIC ELEMENT AND MANUFACTURING METHOD THEREOF

[75] Inventors: Hitoshi Sakata, Higashi-Osaka; Hironobu Tsujimoto; Tsuyoshi Takahama, both of Neyagawa, all of Japan

[73] Assignee: Sanyo Electric Co., Ltd., Osaka, Japan

[21] Appl. No.: 09/161,003

[22] Filed: Sep. 25, 1998

[30] Foreign Application Priority Data

Sep. 26, 1997 [JP] Japan .................................. 9-262514
Sep. 29, 1997 [JP] Japan .................................. 9-264631

[51] Int. Cl.$^7$ ............................................... H01L 31/00
[52] U.S. Cl. .............................................................. 136/256
[58] Field of Search ............................................. 136/256

[56] References Cited

U.S. PATENT DOCUMENTS

5,676,765 10/1997 Saito et al. ............................... 136/258

*Primary Examiner*—Mark Chapman
*Attorney, Agent, or Firm*—Darby & Darby

[57] ABSTRACT

A photovoltaic element includes a collecting electrode formed via a transparent conductive film on a semiconductive layer having a semiconductor junction, wherein a conductive film is disposed on the collecting electrode. A modular structure is adopted in which a plurality of photovoltaic elements having such a structure are connected in series via a tab soldered onto the conductive film. On a light-transmission side, a conductive film is disposed to cover an entire surface of the transparent conductive film. This conductive film is allowed to act as a reflection film on a back surface side. A screen printing process is repeated for a plural number of times so that the collecting electrode is formed with a flattened surface.

3 Claims, 9 Drawing Sheets

PHOTOVOLTAIC ELEMENT AND MANUFACTURING METHOD THEREOF

BACKGROUND OF THE INVENTION

The present invention relates to a photovoltaic element which generates an electric power by incidence of light, and a manufacturing method thereof.

Figure 1:
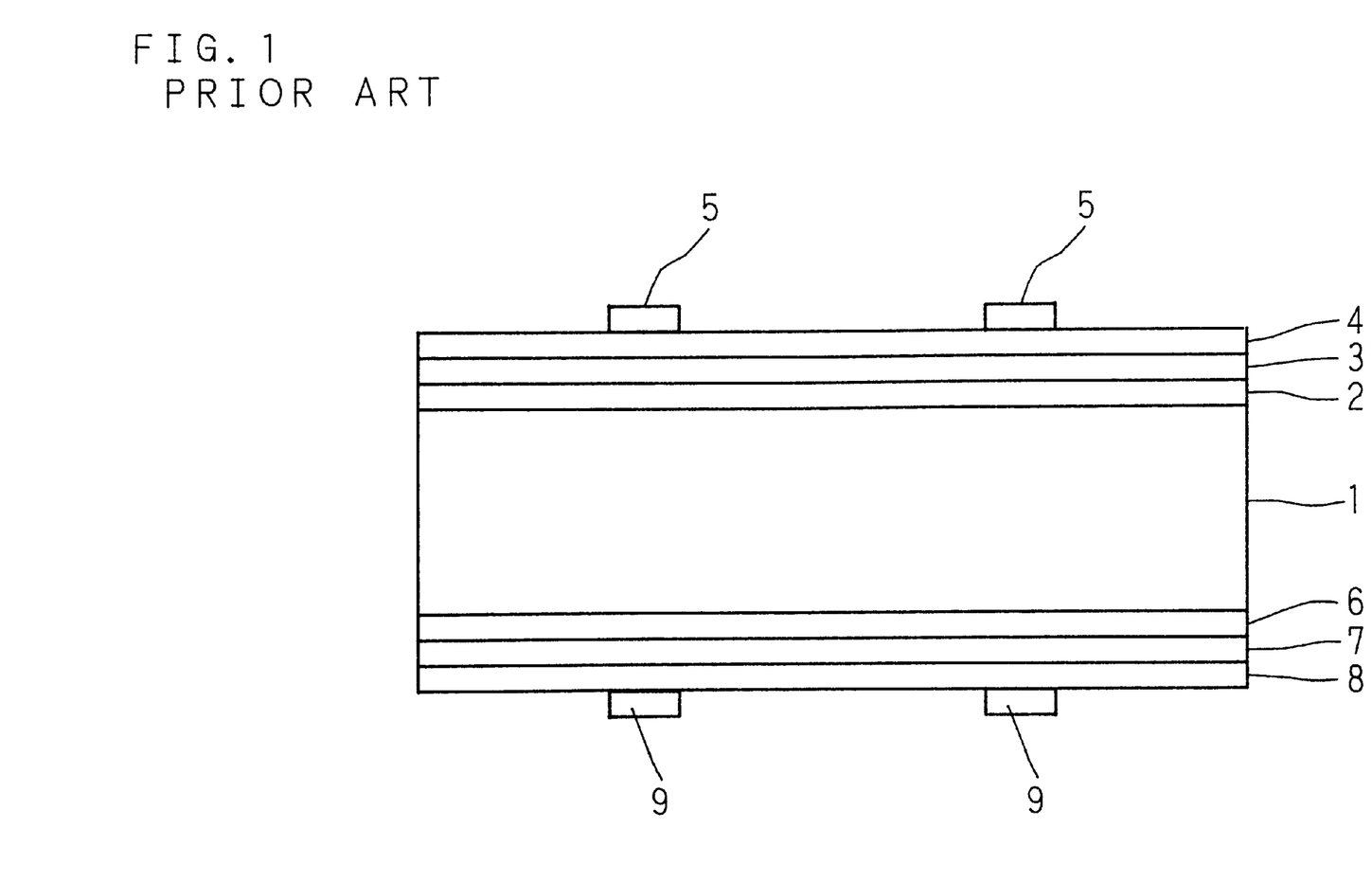
FIG. 1 is a cross-sectional view of a photovoltaic element in a conventional example.

FIG. 1 shows a cross sectional view showing a structure of a conventional photovoltaic element having a hetero junction in which a crystalline semiconductor and an amorphous semiconductor are used. Referring to FIG. 1, the reference numeral 1 represents an n-type crystalline silicon substrate made of a crystalline semiconductor such as single crystal silicon or polycrystal silicon. An i-type amorphous silicon layer 2 and a p-type amorphous silicon layer 3 are laminated in this order on one principal plane (front surface) of the crystalline silicon substrate 1. Further, a transparent conductive film 4 made of, for example, ITO and a comb-like collecting electrode 5 made of Ag are formed thereon. An i-type amorphous silicon layer 6 and an n-type amorphous silicon layer 7 are laminated in this order on the other principal plane (back surface) of the crystalline silicon substrate 1. Further, a transparent conductive film 8 made of, for example, ITO and a comb-like collecting electrode 9 made of Ag are formed thereon.

In practical use as a solar cell, a modular structure is adopted in which numerous photovoltaic elements having such a structure are connected in series via tabs soldered onto the collecting electrodes 5, 9.

The conventional photovoltaic element is manufactured according to the following procedure. First, by means of the plasma CVD method, the i-type amorphous silicon layer 2 and the p-type amorphous silicon layer 3 are successively formed on one principal plane of the crystalline silicon substrate 1, and also the i-type amorphous silicon layer 6 and the n-type amorphous silicon layer 7 are successively formed on the other principal plane of the crystalline silicon substrate 1. Then, by means of the sputtering method, the transparent conductive film 4 and the transparent conductive film 8 are formed on the amorphous silicon layer 3 and on the amorphous silicon layer 7, respectively, and further, by means of the screen printing method, the comb-like collecting electrodes 5, 9 are formed on the transparent conductive film 4 and on the transparent conductive film 8, respectively.

In the photovoltaic element having such a structure, since each of the constitutions other than the crystalline silicon substrate 1 can be formed at a temperature below 200° C. by means of the plasma CVD method, the sputtering method, the screen printing method, or the like, the substrate can be prevented from warping and the manufacturing costs can be reduced. Further, the photovoltaic element having such a structure is manufactured in a low temperature environment in order to inhibit heat damages to the amorphous silicon layers 2, 3, 6, 7, so that a paste of low temperature cure type is used as an Ag paste for the collecting electrodes 5, 9. Accordingly, the electric resistance of the collecting electrodes is high.

In the conventional photovoltaic element as mentioned above, since the Ag paste used for the collecting electrodes 5, 9 is of low temperature cure type, the range of conditions for soldering the collecting electrodes to connect the photovoltaic elements in series is narrow, so that management of the conditions is difficult, solderability is poor, and there is a great possibility of insufficient soldering because silver may be taken solder or a migration may take place by the soldering process.

Figure 2A:
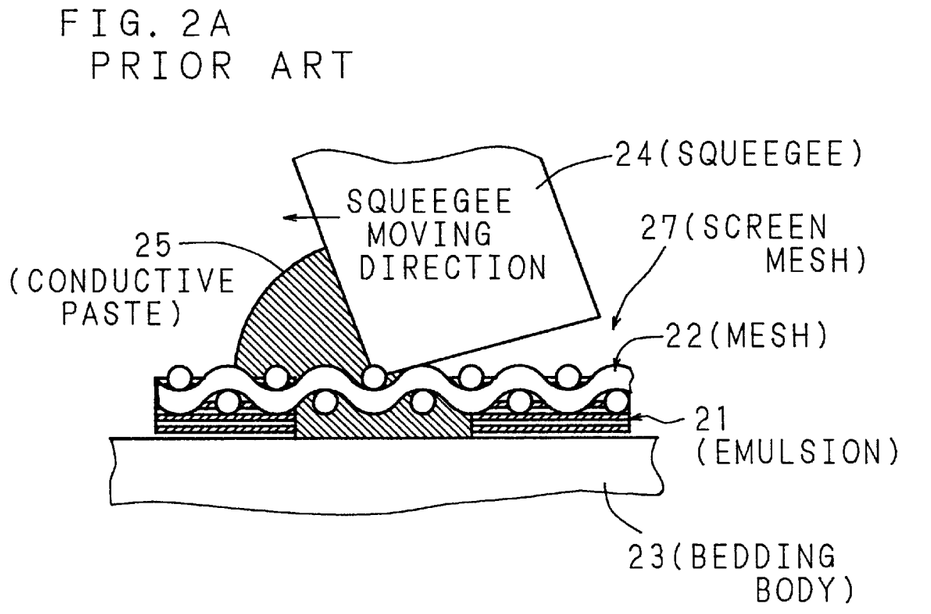
FIG. 2A is a model view illustrating a conventional screen printing process.
Figure 2B:
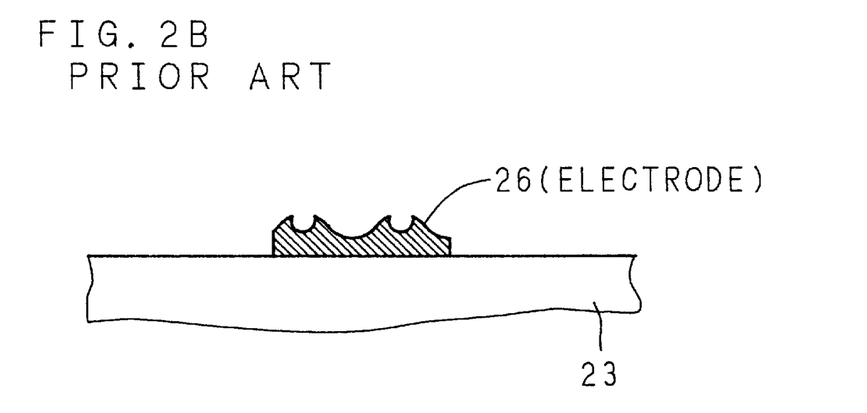
FIG. 2B is a view illustrating a shape of an electrode formed by the conventional screen printing process.

FIGS. 2A and 2B are model views showing a screen printing process using a conductive paste (Ag paste) utilized for forming the collecting electrodes 5, 9 in a method for manufacturing the above-mentioned conventional photovoltaic element. FIG. 2A shows a view during the process and FIG. 2B shows a shape of the electrode when the process is finished. An emulsion 21 and a mesh 22 are integrated to form a screen mesh 27, and a bedding body 23 is covered with the screen mesh 27 in which a portion of the emulsion 21 is removed in correspondence with a position of an electrode to be formed. Then, a conductive paste 25 is applied onto the bedding body 23 by moving a squeegee 24 to form an electrode 26 having a predetermined width.

In such a screen printing process, 40 $\mu$m is an upper limit of the thickness of the electrode with respect to a line width of 120 $\mu$m by one printing process, and also there will be a great variation of thickness. Further, a large unevenness of the electrode 26 occurs owing to a patterning shape of the mesh 22, as shown in FIG. 2B. Because of these reasons, the electric resistance will be high and the loss of electric current will be large, thereby giving rise to some of the factors that inhibit improvement of photoelectric conversion properties.

BRIEF SUMMARY OF THE INVENTION

An object of the present invention is to provide a photovoltaic element and a manufacturing method thereof that facilitate soldering by disposing a conductive film on an upper surface of a collecting electrode, as compared with a conventional example in which soldering is carried out directly on the collecting electrode.

Another object of the present invention is to provide a photovoltaic element and a manufacturing method thereof that can improve conversion efficiency by a back reflection effect by disposing a conductive film, which is disposed on an upper surface of the collecting electrode on a back surface side (light-transmission side), to cover an entire surface of a transparent conductive film.

Still another object of the present invention is to provide a photovoltaic element and a manufacturing method thereof that can reduce surface unevenness of the collecting electrode formed by a screen printing process to decrease its electric resistance, thereby contributing to improvement of the photoelectric conversion properties.

A photovoltaic element of the present invention includes a collecting electrode formed via a transparent conductive film on a semiconductive layer having a semiconductor junction, and a conductive film is disposed on the collecting electrode. In manufacturing modules, a tab is soldered onto the conductive film. Therefore, even if the collecting electrode is formed using a conductive paste of low temperature cure type, an improved soldering contact can be obtained as compared with a conventional example in which soldering is carried out directly on the collecting electrode.

A material for the conductive film may be a metal such as Ag, Cu, Ni, Cr, Ti, Al, or an alloy thereof. However, in view of soldering the tab, it is preferable to use a metal which has a good solderability, such as Ag, Cu, Ni, or Cr. Also, on the back surface side (light-transmission side), by disposing the conductive film to cover the entire surface of the transparent conductive film, the conductive film will act as a reflection film on the back surface side, thereby increasing the back reflection effect and improving the conversion efficiency. Further, a higher conversion efficiency can be realized by using a metal such as Ag having a high reflectivity of light as the material for the conductive film on the back surface side.

In the present invention, the screen printing process is repeated for a plural number of times in forming the collecting electrode. This flattens the collecting electrode to be formed by reducing the surface unevenness. Also, in repeating the screen printing process, a different mesh pattern is used each time when the screen printing process is carried out. This flattens the surface of the collecting electrode further. By reduction of the surface unevenness, electric resistance of the collecting electrode can be prevented from becoming high and the photoelectric conversion efficiency, especially F.F. (fill factor), can be improved even if a conductive paste of high electric resistance for low temperature environment is used.

The above and further objects and features of the invention will more fully be apparent from the following detailed description with accompanying drawings.

DETAILED DESCRIPTION OF THE INVENTION

Hereafter, the present invention will be detailed with reference to the drawings which illustrate the embodiments according to the present invention.

Figure 3:
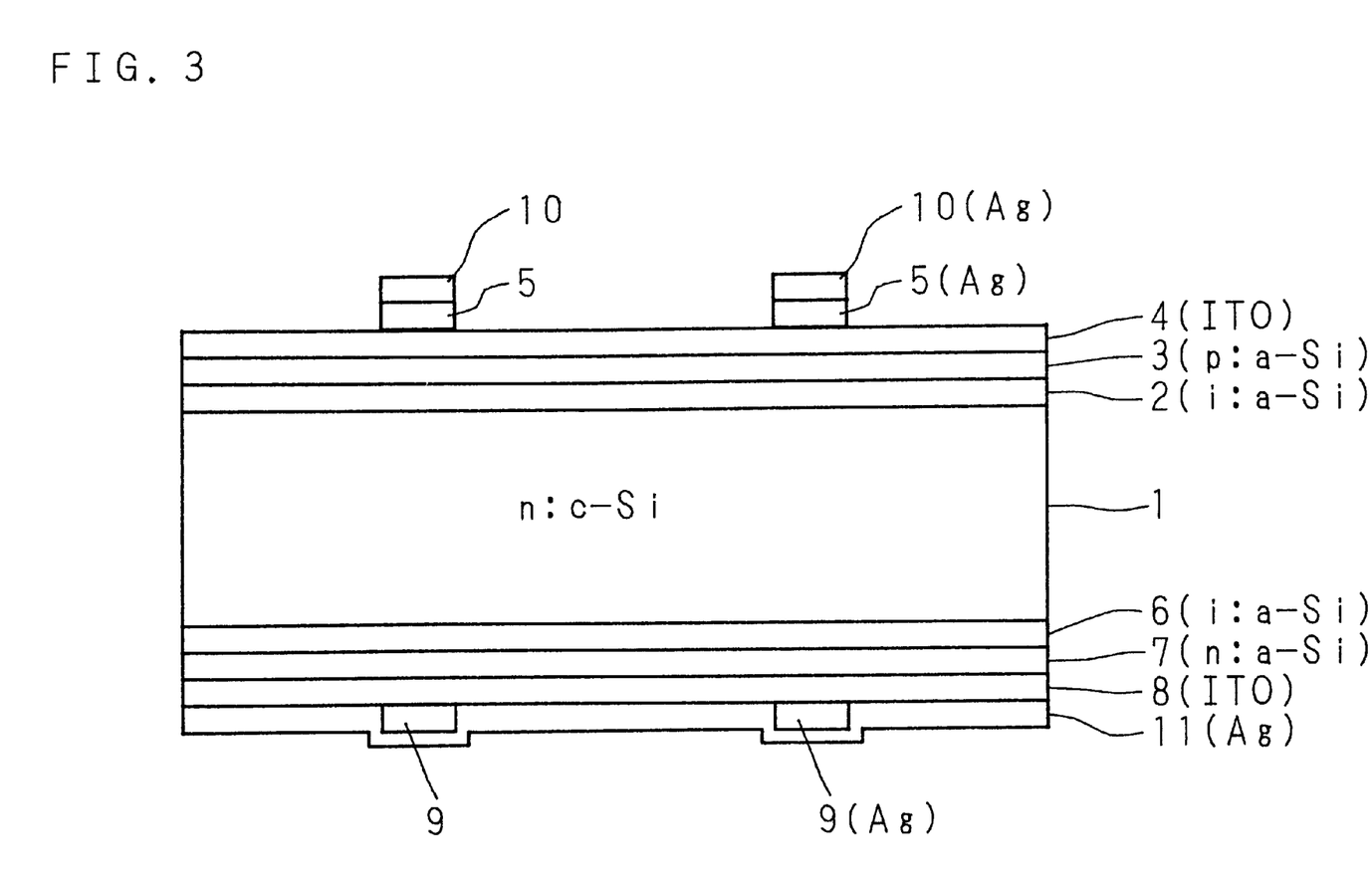
FIG. 3 is a cross-sectional view of a photovoltaic element according to the present invention.

FIG. 3 is a cross-sectional view illustrating a structure of a photovoltaic element of the present invention. Referring to FIG. 3, the reference numeral 1 represents an n-type crystalline silicon substrate made of a crystalline semiconductor such as single crystal silicon or polycrystal silicon. An i-type amorphous silicon layer 2 (thickness: 100 Å) and a p-type amorphous silicon layer 3 (thickness: 100 Å) are laminated in this order on one principal plane (front surface) of the crystalline silicon substrate 1. Further, a transparent conductive film 4 (thickness: 700 Å) made of, for example, ITO and a comb-like collecting electrode 5 made of Ag, are formed thereon. Also, a conductive film 10 (thickness: several hundred to 5000 Å) made of, for example, Ag is formed on the collecting electrode 5.

An i-type amorphous silicon layer 6 (thickness: 100 Å) and an n-type amorphous silicon layer 7 (thickness: 100 Å) are laminated in this order on the other principal plane (back surface) of the crystalline silicon substrate 1. Further, a transparent conductive film 8 (thickness: 700 Å) made of, for example, ITO and a comb-like collecting electrode 9 made of Ag are formed thereon. Also, a conductive film 11 (thickness: several hundred to 5000 Å) made of, for example, Ag is formed on the transparent conductive film 8 and on the collecting electrode 9. Here, in this embodiment, the conductive film 11 formed on the collecting electrode 9 on the back surface side is disposed to cover the entire surface of the transparent conductive film 8 on the back surface side.

Figure 4:
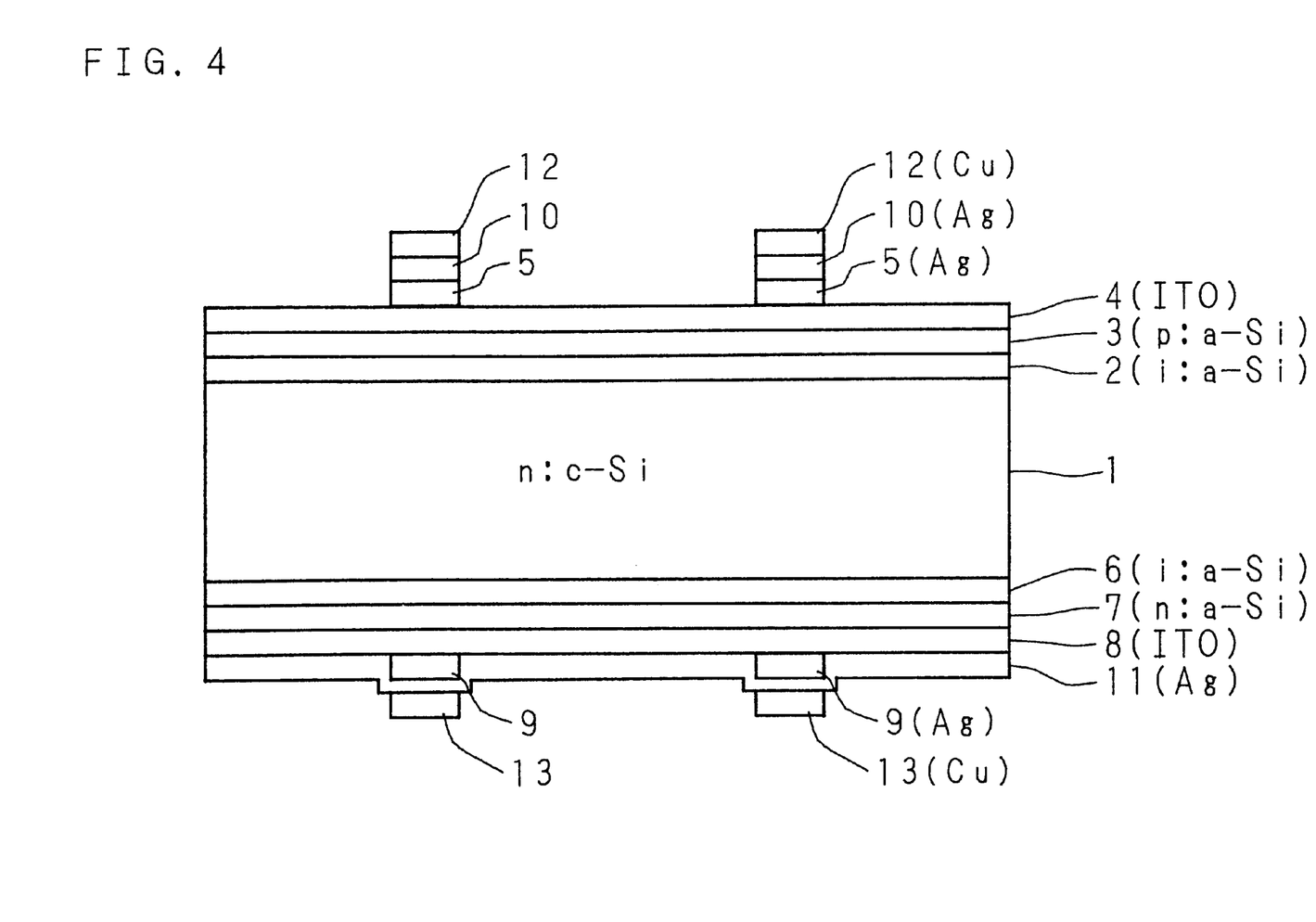
FIG. 4 is a cross-sectional view illustrating a state in which tabs are soldered onto the photovoltaic element of the present invention.

According to the photovoltaic element of the embodiment as described above, tabs can be securely soldered via the conductive films 10, 11 onto the collecting electrodes 5, 9 even if the collecting electrodes 5, 9 are formed using a metal paste of low temperature cure type. Further, since silver is not taken solder and migration does not take place because of soldering, a long term reliability can be improved. FIG. 4 illustrates a state in which tabs 12, 13 made of copper foil are soldered via the conductive films 10, 11 onto the collecting electrodes 5, 9. Through these tabs 12, 13, a plurality of photovoltaic elements are connected in series to manufacture a solar cell having a modular structure.

Also, according to the photovoltaic element of this embodiment, the conductive film 11 provided on the collecting electrode 9 on the back surface side is disposed to cover the entire surface of the transparent conductive film 8 on the back surface side. Therefore, a back reflection effect is produced owing to the conductive film 11, whereby the maximum property of the conversion efficiency can be improved by about 2.5% as compared with a conventional example in which the conductive film is not provided. In order to maximize this back reflection effect, it is preferable to use a metal such as Ag having a high reflectivity as described above, as a material for the conductive film 11.

Next, a method for manufacturing a photovoltaic element having such a structure according to the present invention will now be explained. FIGS. 5A to 5F are cross-sectional views illustrating a manufacturing process therefor.

Figure 5A:
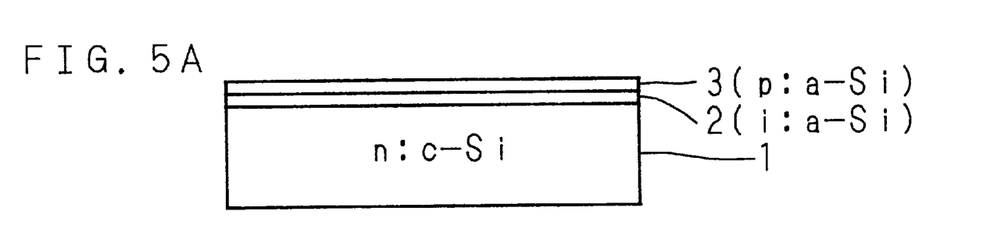
FIGS. 5A to 5F are cross-sectional views illustrating a process for manufacturing the photovoltaic element of the present invention.
Figure 5B:
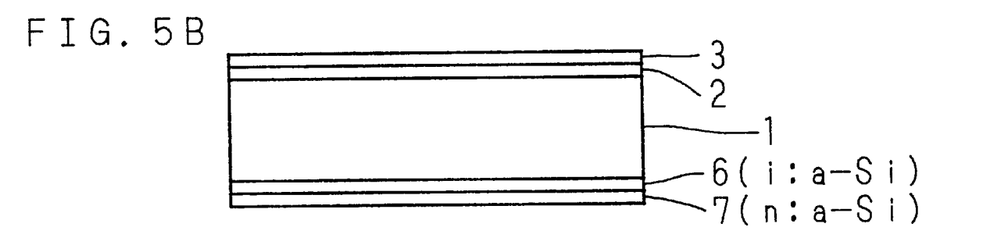

First, the i-type amorphous silicon layer 2 is formed on one principal plane of the n-type crystalline silicon substrate 1 by means of the plasma CVD method using $SiH_4$. Further, the p-type amorphous silicon layer 3 is formed thereon by means of the plasma CVD method using a mixture gas of $SiH_4$ and $B_2H_6$ (FIG. 5A). Also, the i-type amorphous silicon layer 6 is formed on the other principal plane of the crystalline silicon substrate 1 by means of the plasma CVD method using $SiH_4$. Further, the n-type amorphous silicon layer 7 is formed thereon by means of the plasma CVD method using a mixture gas of $SiH_4$ and $PH_3$ (FIG. 5B).

Figure 5C:
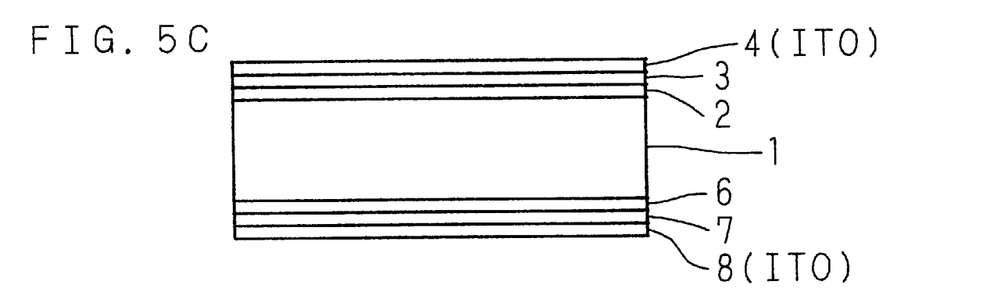
Figure 5D:
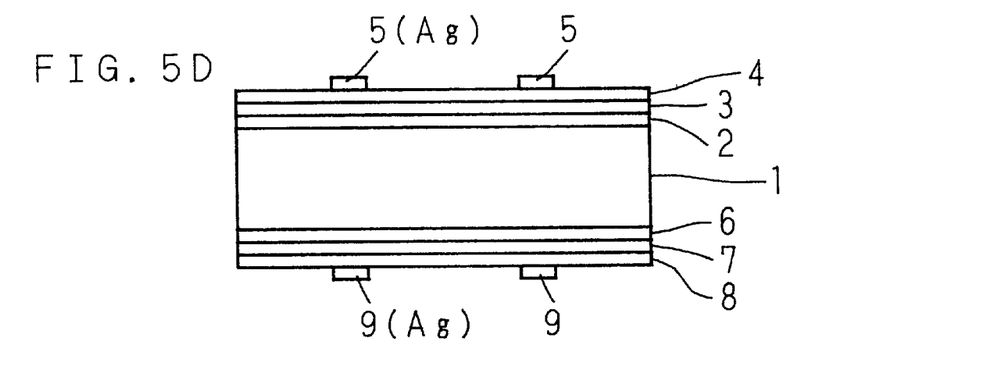

Second, the transparent conductive film 4 and the transparent conductive film 8, each made of ITO, are formed on the amorphous silicon layer 3 and on the amorphous silicon layer 7, respectively, by means of the sputtering method (FIG. 5C). Then, the collecting electrode 5 and the collecting electrode 9 are formed on the transparent conductive film 4 and on the transparent conductive film 8, respectively, by means of the screen printing method using an Ag paste (FIG. 5D). The process for forming the collecting electrodes 5, 9 by means of this screen printing method will be detailed later.

Figure 5E:
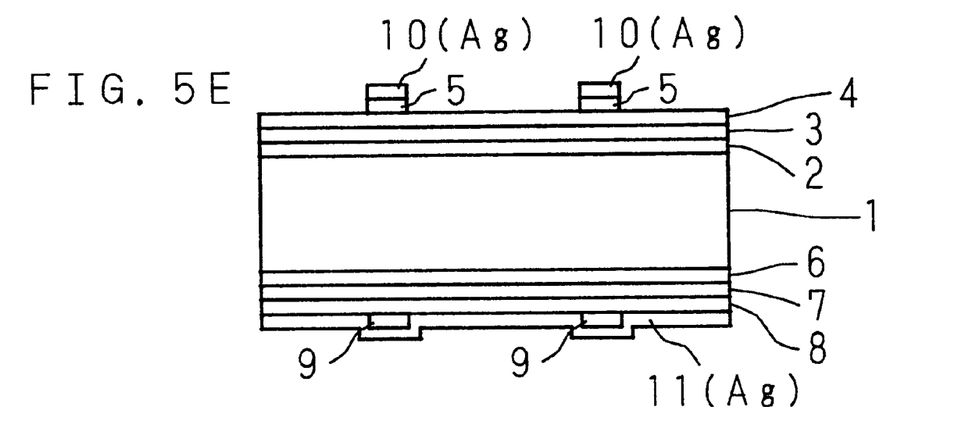

Third, the conductive film 10 and the conductive film 11 are formed on the collecting electrode 5 and on the transparent conductive film 8 including the surface of the collecting electrode 9, respectively, by means of the sputtering method (FIG. 5E). The sputtering condition used therein is as follows.

---
Target: Ag
Heating temperature: 150° C.
Sputtering pressure: 3 × 10$^{-3}$ Torr

---

Here, the conductive films 10, 11 are formed by means of the sputtering method. Alternatively, the conductive films 10, 11 may be formed by vapor deposition process using resistance heating or energy beams or by a plating process.

Figure 5F:
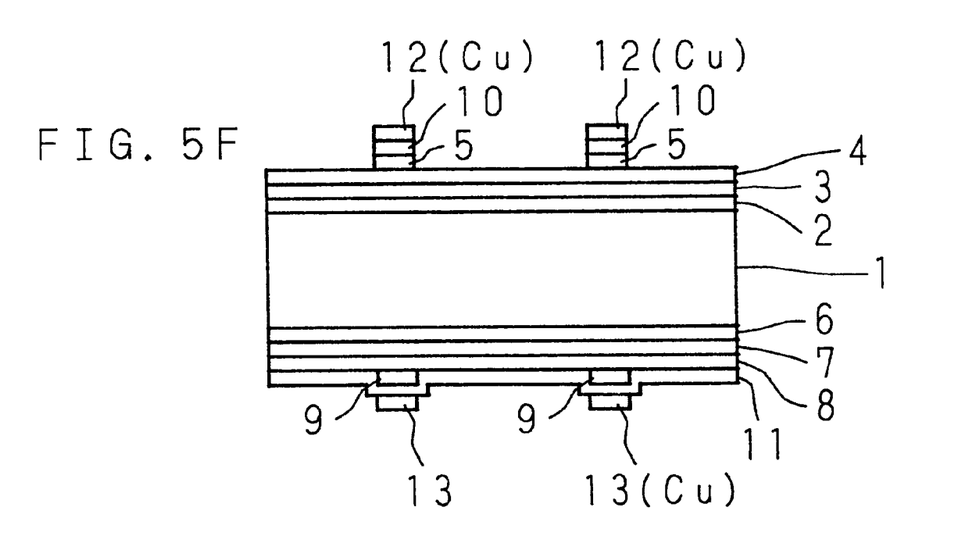

Further, a tab 12 and a tab 13 made of copper foil are formed by soldering at positions on the conductive film 10 and on the conductive film 11 corresponding to the collecting electrode 5 and the collecting electrode 9, respectively (FIG. 5F).

Figure 6A:
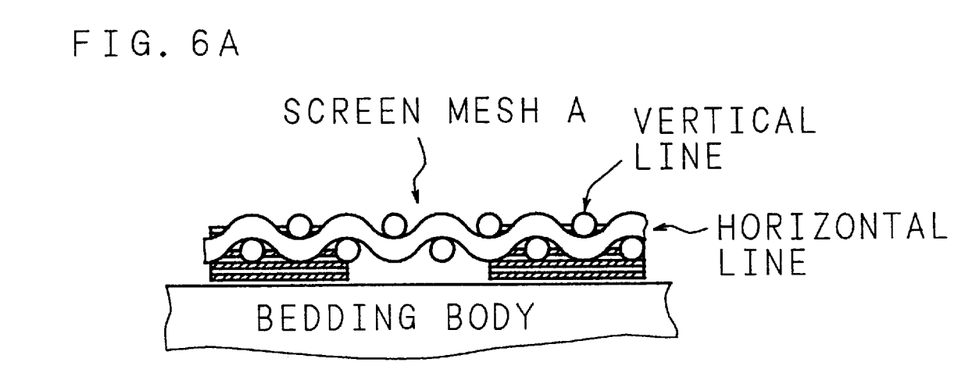
FIG. 6A is a view illustrating a screen mesh A to be used in the first screen printing process.
Figure 6B:
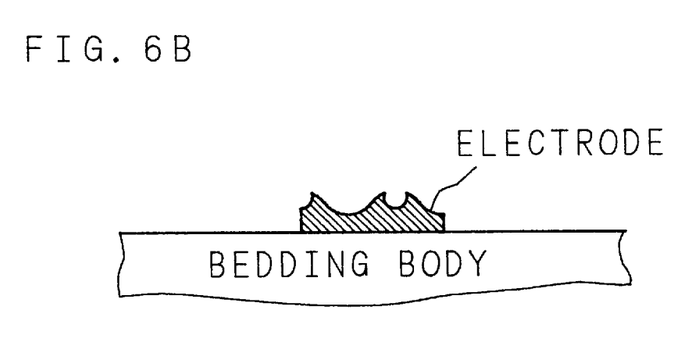
FIG. 6B is a view illustrating a shape of an electrode formed by using the screen mesh A.
Figure 7A:
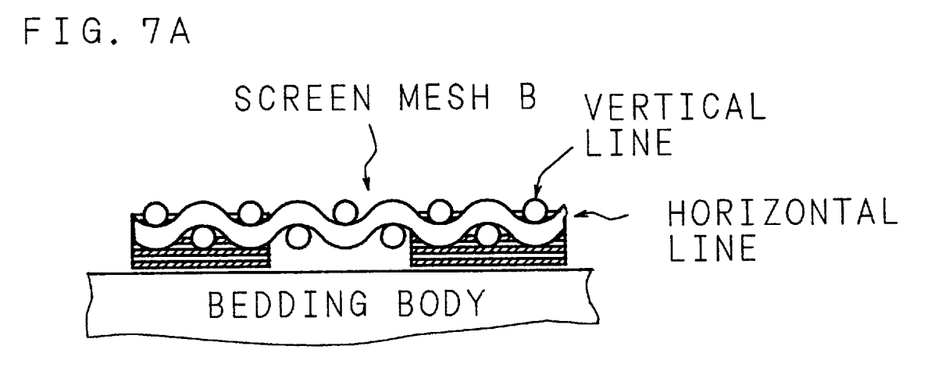
FIG. 7A is a view illustrating a screen mesh B to be used in the second screen printing process.
Figure 7B:
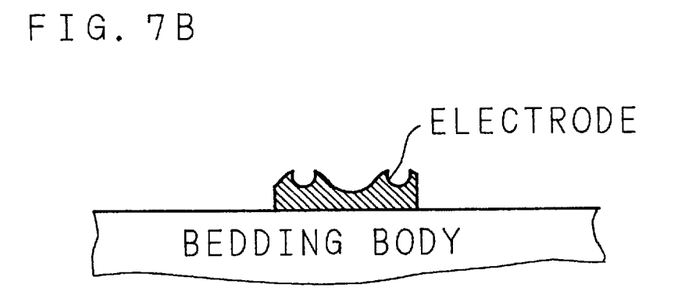
FIG. 7B is a view illustrating a shape of an electrode formed by using the screen mesh B.

Hereafter, a procedure for forming the collecting electrode 5 by means of the screen printing method using an Ag paste in the above-mentioned process will be explained. The procedure for forming the collecting electrode 9 on the light-transmission side (back surface side) is the same as the procedure for forming the collecting electrode 5 on the light-incidence side (front surface side). In forming the collecting electrode 5, the printing process is repeated twice by changing the screen mesh pattern. FIGS. 6A, 6B, 7A, 7B are views illustrating two types of screen meshes having different patterns to be used in the present invention and shapes of the electrodes formed by using these screen meshes. FIGS. 6A, 6B illustrate a screen mesh A to be used in the first printing process and a shape of the electrode after the first printing process using the screen mesh A. FIGS. 7A, 7B illustrate a screen mesh B to be used in the second printing process and a shape of the electrode after the second printing process using the screen mesh B. The peak position of a horizontal line is different between the screen mesh A and the screen mesh B at a portion where the electrode is to be formed, and surface unevenness patterns of the formed electrodes are also different.

According to the present invention, the screen mesh A as shown in FIG. 6A is used in the first printing process, and the screen mesh B as shown in FIG. 7A is used in the second printing process. The following table 1 shows a result of experiment on thickness variation after each printing process when the collecting electrode 5 having a line width of 0.12 mm is formed as described above.

TABLE 1

|  | Thickness |
|---|---|
| After first printing | 38 μm ± 25% |
| After second printing | 50 μm ± 9% |

Table 1 shows that the unevenness of the formed electrode can be reduced by conducting an overlay printing process using the two screen meshes A, B having different patterns as shown above. This is due to the fact that the unevenness brought about by the patterns of the two screen meshes A, B has been canceled with each other by the overlay printing and that Ag has flowed to places of lower pressure by repeating the printing process twice because the Ag paste has a high viscosity,.

Figure 8:
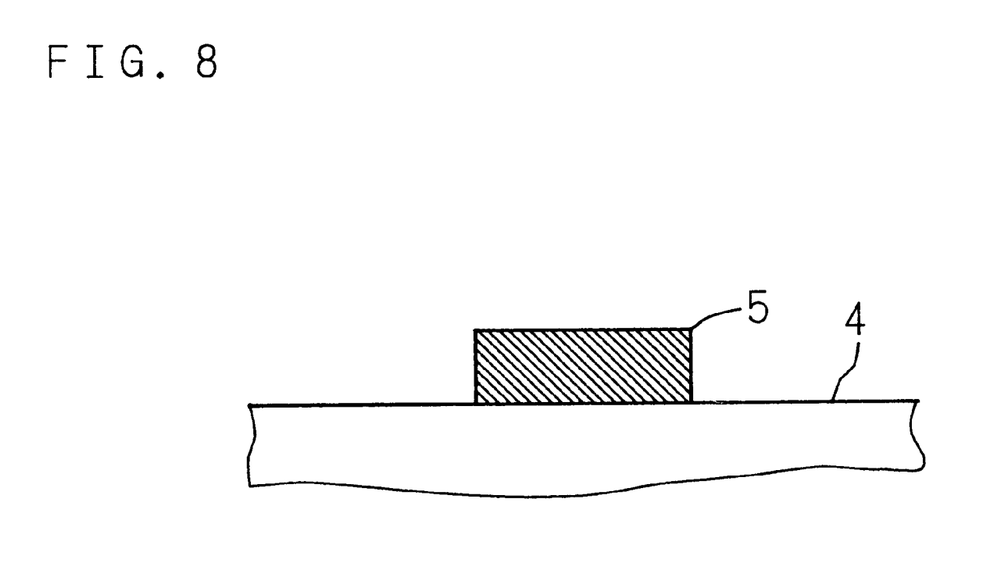
FIG. 8 is a view illustrating a shape of a collecting electrode formed according to the present invention.

Thus, the collecting electrode 5 having a surface flattened by reducing the surface unevenness can be formed, as shown in FIG. 8, by repeating the printing process twice using different mesh patterns.

Next, the characteristics of the photovoltaic element manufactured as above will be explained hereafter. First, the electric resistance of the collecting electrode 5 was reduced by 25% in accordance with the decrease in the surface unevenness as compared with a photovoltaic element manufactured by a conventional method (by one screen printing process). Also, the F.F., which is one of the photoelectric conversion properties, was 0.75 as compared to 0.70 of a conventional example, thus showing an improvement of 7.1%. Further, it was confirmed that the output of a solar cell of 103 mm square size obtained by connecting and arranging a number of these photovoltaic elements in series showed an improvement of 6% as compared with the conventional example.

In the above example, screen meshes having different patters were used. However, it was found out that, even when the screen printing process was repeated twice using the same screen mesh, the electric resistance was reduced by 20% and the F.F. was improved by 6.3% as compared with the conventional example.

Here, it is to be noted that the material for the conductive films 10, 11 is not limited to Ag alone, so that another metal such as Cu, Ni, Cr, Ti, Al, or an alloy thereof may be used. However, in view of soldering a tab in a later step, it is preferable to use a metal having a good solderability such as Cu, Ni, or Cr. Further, the material for the collecting electrodes 5, 9 is not limited to Ag alone, so that another metal such as Cu, Ni, Ti, Al, Cr, or an alloy thereof may be used.

In this example, the conductivity type of the crystalline silicon substrate 1 is n-type. Alternatively, however, the conductivity type of the crystalline silicon substrate 1 may be p-type as long as a hetero junction of an opposite conductivity type is formed on the light-incidence side.

In the above-described embodiment, a photovoltaic element composed of a crystalline semiconductive and an amorphous semiconductor has been explained. However, the present invention is not limited to the above embodiment alone, so that any construction may be adopted as long as the photovoltaic element has a structure in which a collecting electrode is provided via a transparent conductive film on an amorphous semiconductive layer. Examples of the photovoltaic element having such a construction include one having a structure of metal substrate/amorphous semiconductive layer of nip construction/transparent conductive film/collecting electrode, one having a structure in which an amorphous semiconductive layer is disposed only on a light-incidence side of a crystalline substrate, and one having a structure in which an amorphous semiconductive layer is disposed only on a light-transmission side of a crystalline substrate.

As shown above, since the photovoltaic element of the present invention is provided with a conductive film formed on an upper surface of a collecting electrode, the solderability can be improved without an increase in the contact resistance caused by silver being taken solder at the time of soldering, so that the soldering contact of the tabs can be improved and the soldering process is facilitated.

Also, on the back surface side, a conductive film is provided to cover an entire surface of a transparent conductive film, so that the conductive film acts as a light-reflection film to increase the back reflection effect, whereby the conversion efficiency can be improved.

Further, since the collecting electrode is formed by repeating the screen printing process for a plural number of times using a conductive paste, the surface unevenness of the collecting electrode caused by the screen mesh pattern can be reduced, so that the collecting electrode can have a lower electric resistance, thereby contributing to improvement of the photoelectric conversion properties. Also, in this process, by using a screen mesh having a different pattern for each printing step, a more excellent effect can be produced.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A photovoltaic element comprising:

a semiconductive layer having a semiconductor junction;

a transparent conductive film disposed on said semiconductive layer;

a collecting electrode disposed on said transparent conductive film; and a conductive film which is disposed on said collecting electrode and on which a tab is to be formed.

2. The photovoltaic element according to claim 1, wherein said conductive film comprises a metal having a good solderability.

3. The photovoltaic element according to claim 1, wherein said collecting electrode is formed by repeating a screen printing process for a plural number of times.

* * * * *